(12) United States Patent
Okita et al.

(10) Patent No.: US 10,892,190 B2
(45) Date of Patent: Jan. 12, 2021

(54) MANUFACTURING PROCESS OF ELEMENT CHIP

(71) Applicant: Panasonic Intellectual Property Management Co., Ltd., Osaka (JP)

(72) Inventors: Shogo Okita, Hyogo (JP); Atsushi Harikai, Osaka (JP); Noriyuki Matsubara, Osaka (JP); Hidefumi Saeki, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 32 days.

(21) Appl. No.: 16/246,627

(22) Filed: Jan. 14, 2019

(65) Prior Publication Data

US 2019/0221479 A1     Jul. 18, 2019

(30) Foreign Application Priority Data

Jan. 17, 2018 (JP) .................................. 2018-005933

(51) Int. Cl.
| | |
|---|---|
| *H01L 21/78* | (2006.01) |
| *H01L 21/56* | (2006.01) |
| *H01L 21/683* | (2006.01) |
| *H01L 21/3065* | (2006.01) |
| *H01J 37/00* | (2006.01) |
| *H01L 21/311* | (2006.01) |
| *H01L 21/687* | (2006.01) |
| *H01L 21/67* | (2006.01) |

(52) U.S. Cl.
CPC .............. *H01L 21/78* (2013.01); *H01J 37/00* (2013.01); *H01L 21/3065* (2013.01); *H01L 21/31138* (2013.01); *H01L 21/561* (2013.01); *H01L 21/6836* (2013.01); *H01L 21/67109* (2013.01); *H01L 21/68742* (2013.01)

(58) Field of Classification Search
None
See application file for complete search history.

(56) References Cited

U.S. PATENT DOCUMENTS

| 9,142,459 B1* | 9/2015 | Kumar | H01L 21/0337 |
| 2001/0010571 A1* | 8/2001 | Kanou | G02F 1/133553 |
| | | | 349/113 |
| 2018/0308755 A1* | 10/2018 | Tabuchi | H01L 21/6836 |

FOREIGN PATENT DOCUMENTS

JP      2017-114945 A      6/2017

* cited by examiner

*Primary Examiner* — Jay C Chang
(74) *Attorney, Agent, or Firm* — Pearne & Gordon LLP

(57) ABSTRACT

A manufacturing process of an element chip comprises steps of preparing a substrate including dicing regions and element regions, attaching a holding sheet held on a frame with a die attach film in between, forming a protective film covering the substrate, forming a plurality of grooves in the protective film along the dicing regions, plasma-etching the substrate to expose the die attach film and then die attach film along the dicing regions, and picking up each of the element chips along with the separated die attach film away from the holding sheet, wherein the die attach film has an area greater than that of the substrate, and wherein the protective film includes a first covering portion covering the substrate and a second covering portion covering at least a portion of the die attach film that extends beyond an outer edge of the substrate.

15 Claims, 8 Drawing Sheets

MANUFACTURING PROCESS OF ELEMENT CHIP

CROSS REFERENCE TO RELATED APPLICATION

The present application is based on and claims priority under 35 U.S.C. § 119 with respect to the Japanese Patent Application No. 2018-005933 filed on Jan. 17, 2018, of which entire content is incorporated herein by reference into the present application.

TECHNICAL FIELD

The present invention relates to a manufacturing process of an element chip, and in particular to a step for individualizing or dicing a substrate attached on a die attach film by means of a plasma-etching technique.

BACKGROUND

When producing a plurality of multi-layered element chips such as a flash memory from a single substrate, the substrate may be attached on a die attach film (which may also be referred to as a die bonding film) and individualized or diced into the element chips as disclosed in Patent Document 1 (JPA 2017-114945). The die attach film has an adherence property and performs functions as a dicing tape and a bonding member. As such, the die attach film facilitates handling the substrate and picking up the diced element chips, and provides the diced element chips with the bonding member.

Typically, the substrate with the die attach film (DAF) attached thereon are diced (or half-cut) in a physical process such as a mechanical dicing and a stealth dicing (SD), and then the DAF is separated or cut off by means of the other technique, which may be, for example, a cool expanding process and a laser ablation process.

In the meanwhile, as a package of a semiconductor device has been smaller and thinner, the substrate has been thinner. Also, in the multi-layered device such as the flash memory, as the multi-layered technology has been advanced, the substrate has further been thinner, and the recent thickness of the substrate is approximately 30 μm and it is expected as thin as approximately 10 μm in the future.

In the cool expanding process, after the substrate attached with the dicing tape and the DAF is half-cut, the dicing tape is expanded. When the substrate is separated at the half-cut positions to produce a plurality of the element chips, the DAF attaching the substrate is also separated. However, when the substrate has the reduced thickness, the strength thereof is also reduced. This makes it difficult to apply the expanding force enough to separate the DAF without avoiding a damage of the substrate. Also, as the functions achieved by the element chips are more complicated, the crystal orientations of silicon that is material of the substrate are more diverse and higher concentration of the doped ions to silicon substrate are required. This likely makes the direction for dicing the substrate inconstant and the direction for separating the DAF unstable.

When applying the laser ablation process, the adherence property of the DAF likely causes burrs formed at the end surfaces, which in turn makes it difficult to have the end surface of the DAF flush with one of the element chips. Also, the separated DAF may be reconnected through the burrs. Furthermore, the laser irradiation is aimed at the positions between the element chips, and thus it is required to map the positions of the element chips, for which the production time likely takes longer.

SUMMARY

One aspect of the present invention relates to a manufacturing process of an element chip, which comprises a first step for preparing a substrate having first and second sides opposed to each other, and including a plurality of dicing regions and element regions defined by the dicing regions, a second step for attaching a holding sheet held on a frame to the second side of the substrate with a die attach film in between, a third step for forming a protective film covering the substrate, a fourth step for forming a plurality of grooves in the protective film to expose the substrate along the dicing regions, a fifth step for plasma-etching the substrate exposed along the dicing regions within a first plasma atmosphere to form a plurality of element chips from the substrate, and to expose the die attach film, a sixth step for plasma-etching the die attach film exposed along the dicing regions within a second plasma atmosphere, to separate the die attach film into pieces corresponding to the element chips, and a seventh step for picking up each of the element chips along with the separated die attach film away from the holding sheet, wherein the die attach film in the second step has an area greater than that of the substrate, and wherein the protective film formed in the third step includes a first covering portion covering the first side of the substrate and a second covering portion covering at least a portion of the die attach film that extends beyond an outer edge of the substrate.

Another aspect of the present invention relates to a manufacturing process of an element chip, which comprises steps of preparing a substrate having first and second sides opposed to each other, and including a plurality of dicing regions and element regions defined by the dicing regions, attaching the second side of the substrate to a die attach film, the die attach film being detachably adhered to a holding sheet that is held on a frame, forming a protective film covering the first surface of the substrate, and at least a portion of the die attach film that extends beyond an outer edge of the substrate, forming a plurality of grooves in the protective film along the dicing regions; and etching the substrate along the grooves under a first plasma etching condition, and then etching the die attach film along the grooves under a second plasma etching condition to separate the die attach film into pieces corresponding to a plurality of element chips.

DETAILED DESCRIPTION

Figure 1:
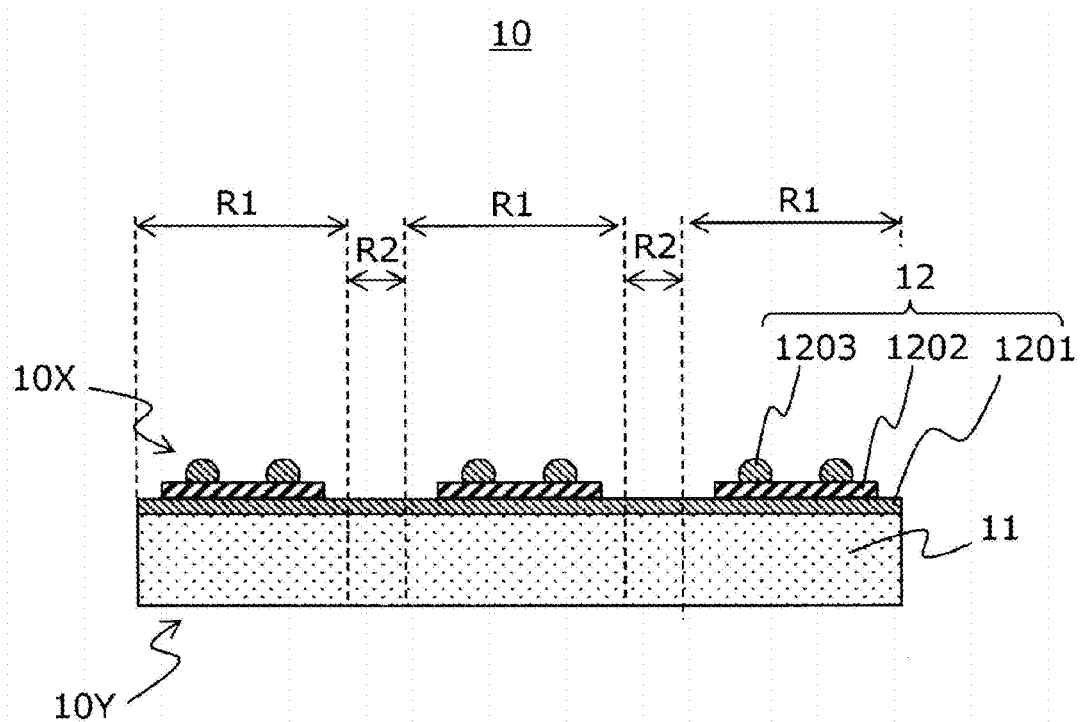
FIG. 1 is a schematic cross-sectional view of a substrate according to one embodiment of the present invention.

A plasma-dicing process has received a lot of attention as a dicing process of a substrate, in which the substrate having a protective layer formed in a predetermined pattern is plasma-etched to dice the substrate into a plurality of element chips.

A die attach film (which is referred to simply as DAF) usually contains a non-volatile material such as an inorganic filler to facilitate handling of the substrate and improve a thermal conductivity. When adapting a plasma-etching technique, the DAF is also exposed to a plasma atmosphere. The DAF and/or the non-volatile material therein may react in a physicochemical manner so that particles of the non-volatile material scatter to adhere on the substrate and/or suspends in the reaction chamber, which leads a contamination of the substrate and/or interferes a desired etching.

To address the drawbacks, according to the present embodiment of the invention, the protective layer is formed to cover the whole substrate and the DAF in a region which may be exposed to the plasma atmosphere. This prevents the non-volatile material in the DAF from scattering in the reaction chamber, thereby to realize the element chips of a high quality. Also, this plasma processing technique allows dicing the substrate and separating the DAF, thereby reducing a cost and time for production.

With reference to attached drawings, a manufacturing process of an element chip will be described hereinafter. A manufacturing process of an element chip according to one embodiment of the present invention comprises a first step for preparing a substrate having first and second sides opposed to each other, and including a plurality of dicing regions and element regions defined by the dicing regions, a second step for attaching a holding sheet held on a frame to the second side of the substrate with a die attach film in between, a third step for forming a protective film covering the substrate attached on the frame, a fourth step for forming a plurality of grooves in the protective film to expose the substrate along the dicing regions, a fifth step for plasma-etching the substrate exposed along the dicing regions within a first plasma atmosphere to expose the die attach film, to form a plurality of element chips from the substrate, a sixth step for plasma-etching the substrate with a second plasma atmosphere to plasma-etch the die attach film along the dicing regions, to separate the die attach film into pieces corresponding to the element chips, and a seventh step for picking up each of the element chips along with the separated die attach film away from the holding sheet, wherein the die attach film between the substrate and the holding sheet in the second step has an area greater than that of the substrate, and wherein the protective film covering the substrate attached on the frame in the third step includes a first covering portion covering the first side of the substrate and a second covering portion covering at least a portion of the die attach film that extends beyond an outer edge of the substrate.

(1) First Step: Firstly, a substrate is prepared, for which the plasma-dicing is carried out. FIG. 1 is a schematic cross-sectional view of the substrate 10 according to an embodiment.

(Substrate) The substrate 10 has first and second sides 10X, 10Y, and contains a plurality of the element regions R1 and the dicing regions R2 defining each of the element regions R1. The substrate 10 comprises a semiconductor layer 11 and a circuit layer 12 stacked on the first side 10 thereof. The substrate 10 is etched along the dicing regions R2 to produce a plurality of element chips 200 each containing the circuit layer 12.

Although not limited thereto, the substrate 10 may have the maximum diameter in a range between 50 mm and 300 mm, for example. Also, although not limited thereto, the substrate 10 may have a shape such as a circle and a rectangle. Besides, the substrate 10 may have a cut-out such as an orientation flat and a notch (not shown).

The semiconductor layer 11 may be made of silicon (Si), gallium arsenide (GaAs), gallium nitride (GaN), or silicon carbide (SiC), for example. The semiconductor layer 11 attached on a holding sheet may have any thickness, which is in a range, for example, between 20 μm and 1000 μm, or preferably between 100 μm and 300 μm.

The circuit layer 12 may compose a semiconductor circuitry, an electronic component, and/or MEMS, and also may contain an insulating layer, a conducting layer, a resin protecting layer such as a polyimide layer, an electrode pad, and a bump. The insulating layer may be laminated with a wiring metal in a stack (as a multi-layered wiring layer or a re-wiring layer). In FIG. 1, the circuit layer 12 includes a multi-layered wiring layer 1201, a re-wiring layer 1202, and bumps 1203.

Typically, after forming the circuit layer 12 on the semiconductor layer 11, the second side 10Y of the substrate 1 is ground in order to thin the substrate 1 (back-grinding step). In the back-grinding step, the second side 10Y (the opposite side of the circuit layer 12) of the substrate 10 is ground to have the desired thickness. Although not limited thereto, any type of back-grinding devices may be used to thin the substrate 10, including for example, a back-grinder having a diamond wheel.

(2) Second Step: The holding sheet 22 is attached on a frame 21, and the die attach film (DAF) 30 is detachably adhering the holding sheet 22. Also, the second side 10Y of the substrate 10 is attached on the DAF 30. Thus, the holding sheet 22 is held on the frame 21 to the second side 10Y of the substrate 10 with the DAF 30 in between.

Figure 2A:
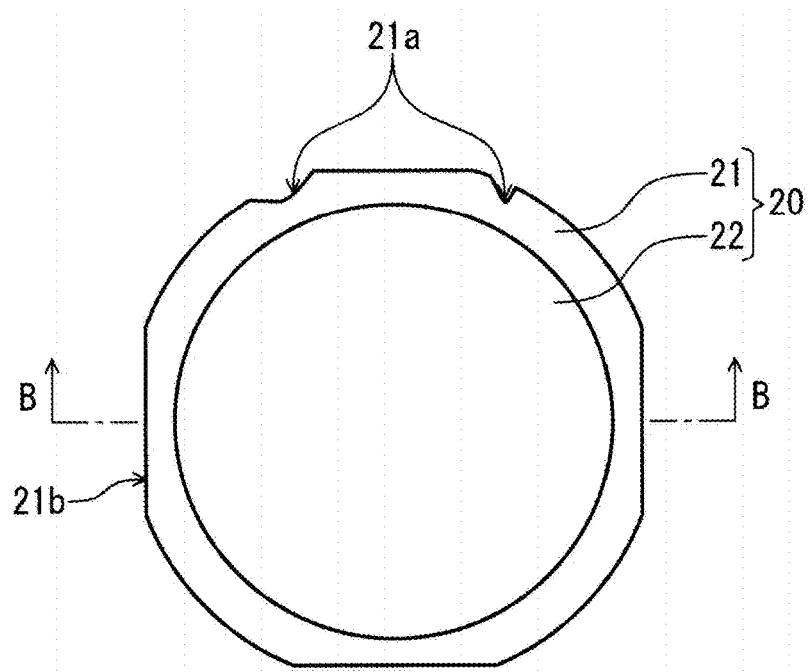
FIG. 2A is a top plan view of a holding sheet and a frame.
Figure 2B:
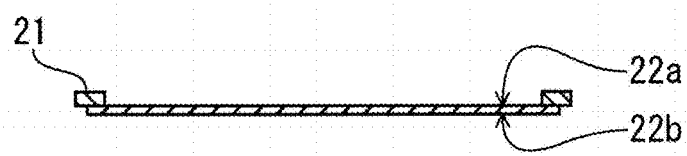
FIG. 2B is a cross-sectional view taken along a line B-B of FIG. 2A.

Referring to FIGS. 2A and 2B, one embodiment of the holding sheet and the frame will be described herein. FIG. 2A is a top plan view of the holding sheet and the frame and FIG. 2B is a cross-sectional view taken along a line B-B of FIG. 2A. Throughout the drawings, components having similar functions are conveniently denoted with similar reference numerals.

(Frame) The frame 21 includes an opening having an area equal to or greater than the whole substrate 10, and has a predetermined width and a substantially constant reduced thickness. Also, the frame 21 has a rigidity such that it can be transferred or delivered with the holding sheet 22 adhering the substrate 10. Although not limited thereto, the opening of the frame 21 may be formed in a circular or polygonal shape such as a rectangle and a hexagon. As shown in FIG. 2A, the frame 21 may be provided with a notch 21a and/or a corner cut 21b for alignment thereof. Also, the frame 21 may be made of, for example, a metal such as aluminum and stainless steel, or a resin. In the present disclosure, the frame 21 and the holding sheet 22 may collectively be referred to as a conveying carrier 20.

(Holding Sheet) The material of the holding sheet 22 is not limited to a particular one. It is preferable that the holding sheet 22 contains an adhesive layer 22a for adhering the substrate 10 and a flexible non-adhesive layer 22b.

The non-adhesive layer 22b may be made of any material, e.g., a thermoplastic resin including, for example, polyolefin such as polyethylene and polypropylene, and polyester such as polyethylene terephthalate. Also, the thermoplastic resin may contain various additives including, for example, a rubber component for adding the stretching property (for example, ethylene-propylene rubber (EPM), ethylene-propylene-diene rubber (EPDM)), a plasticizer, a softener, an antioxidant, and a conductive material. Also, the thermoplastic resin may contain a functional group showing a photopolymerization reaction such as an acryl group. Although not limited thereto, the non-adhesive layer 22b may have a thickness in a range between 50 μm and 300 μm, for example, and preferably between 50 μm and 150 μm.

The holding sheet 22 has a periphery where the adhesive layer 22a adheres one side of the frame 21 and covers the opening of the frame 21. The substrate 10 is attached on the DAF 30 adhering one side (the second side 10Y) thereof, and the DAF 30 is attached on the holding sheet 22. Thus, the holding sheet 22 is held on the frame 21 to the second side 10Y of the substrate 10 with the DAF 30 in between. In the plasma-processing step, the holding sheet 22 is seated on a stage provided within a plasma processing apparatus so that the non-adhesive layer 22b contacts the stage. Thus, the substrate 10 is plasma-etched from the first side 10X through the second side 10Y.

The adhesive layer 22a of the holding sheet 22 preferably contains an adhesive material of which adhesibility is weakened with an ultra-violet beam (UV-radiation). This facilitates each of the diced element chips (together with the DAF 30) obtained after the plasma-dicing step to be peeled off and picked up from the adhesive side 22a with the UV-radiation. The adhesive side 22a of the holding sheet 22 may be formed, for example, by applying an UV-curing acrylic adhesive on one side of the non-adhesive side 22b to have a thickness in a range between 5 μm and 20 μm.

(Die Attach Film (DAF)) The DAF 30 may be made of, for example, a resin composition containing a resin and an inorganic filler. The resin may include, for example, photosensitive phenolic resins such as phenol/formaldehyde novolac resin, cresol/formaldehyde novolac resin, xylenol/formaldehyde novolak resin, resorcinol/formaldehyde novolac resin, and phenol-naphthol/formaldehyde novolak resin.

The inorganic filler may include, for example, aluminum hydroxide, magnesium hydroxide, calcium carbonate, magnesium carbonate, calcium silicate, magnesium silicate, calcium oxide, magnesium oxide, aluminum oxide, aluminum nitride, and silica.

Although not limited thereto, the DAF 30 may have a thickness in a range between 10 μm and 100 μm in view of handling thereof, and preferably in a range between 20 μm and 50 μm.

Figure 3:
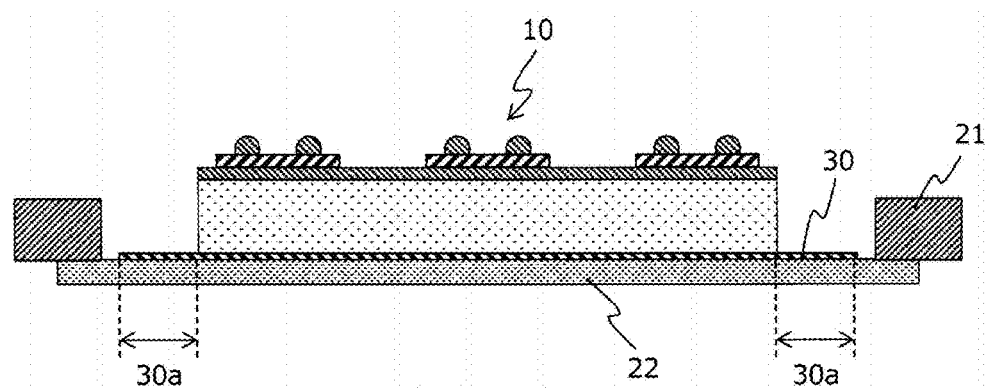
FIG. 3 is a cross-sectional view of the substrate, schematically illustrating the second step of a manufacturing process of an element chip according to the embodiment.

As illustrated in FIG. 3, the DAF 30 is larger than the substrate 10 and may be smaller than the opening of the frame 21. Thus, when the first surface 10X of the substrate 10 is viewed downward, the DAF 30 extends beyond and surround the outer edge of the substrate 10. In this disclosure, a first exposed region 30a is defined as a region of the DAF 30 that extends beyond and surround the outer edge of the substrate 10. FIG. 3 is a cross-sectional view of the substrate 10, schematically illustrating the second step of the manufacturing process according to the embodiment.

Figure 4:
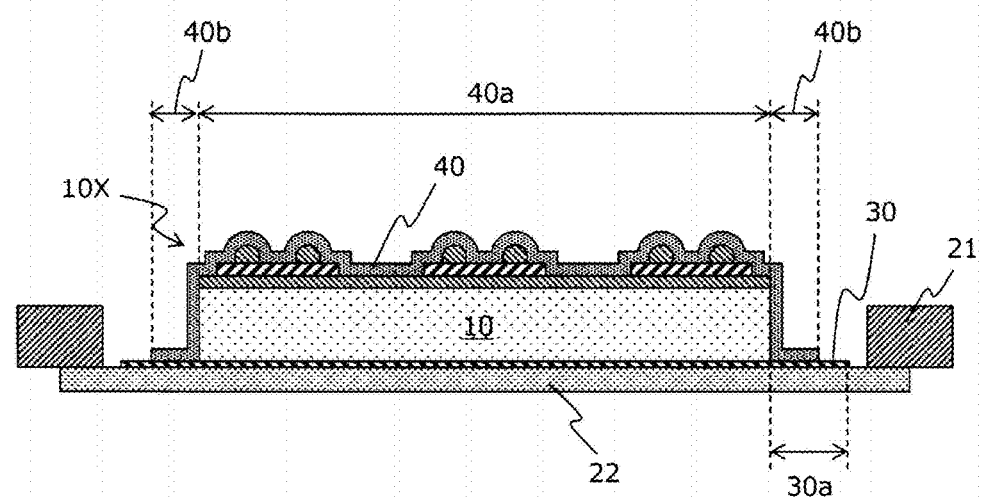
FIG. 4 is a cross-sectional view of the substrate, schematically illustrating the third step of the manufacturing process of the element chip according to the embodiment.

(3) Third Step: In the third step, a protective film 40 covering the substrate 10 is formed. FIG. 4 is a cross-sectional view of the substrate 10, schematically illustrating the third step of the manufacturing process according to the embodiment.

The protective film 40 is formed to protect the element region R1 of the substrate 10 from the plasma exposure. According to the present embodiment, the protective film 40 covers not only the first side 10 of the substrate 10, but also at least a portion of the first exposed region 30 which extends beyond the outer edge of the substrate 10. Thus, the protective film 40 covers a first covering portion 40a covering the first side 10X or the top surface of the substrate 10 and a second covering portion 40b covering at least a portion of the DAF 30 that extends beyond the outer edge of the substrate 10. This prevents the second covering portion 40b of the DAF 30 from the plasma exposure. Even if the DAF 30 is plasma-etched, the non-volatile material from the DAF 30 is avoided to adhere the substrate 10. The second covering portion 40b of the DAF 30 may cover the side surface of the substrate 10 as shown in FIG. 4.

Also, the second covering portion 40b of the protective film 40 may cover the whole of the first exposed region 30a of the DAF 30. It is preferable that the second covering portion 40b of the protective film 40 covers at least the side surface and a region contacting the outer edge of the substrate 10. This reduces the contamination on the substrate with the non-volatile material.

Although not limited thereto, the protective film 40 has a thickness such that it remains (it is not thoroughly removed) even after being plasma-etched in fifth and sixth steps. For example, the thickness of the protective film 40 which will be etched in the fifth and sixth steps may be calculated in advance, and the initial thickness thereof may be deigned to be equal to or greater than the calculated thickness. The etched thickness of the protective film 40 may be calculated in accordance with various factors including the thickness of the semiconductor layer 11 before the fifth step; a masking etch selectivity (a ratio between etching rates of the semiconductor layer 11 and the protective film 40) under the plasma-etching condition of the fifth step; the thickness of the DAF 30 to be etched in the sixth step; and a masking etch selectivity (a ratio between etching rates of the DAF 30 and the protective film 40) under the plasma-etching condition of the sixth step. For example, when the thickness of the semiconductor layer 11 is formed of silicon having the thickness of 30 μm, the masking etch selectivity of the fifth step is in a range between 5-200, and the masking etch selectivity of the sixth step is in a range between 0.5-1.0, then the thickness of the protective film 40 may be in a range between 23 µm and 50 µm.

In order to ensure the protection of the DAF 30, the second covering portion 40b of the protective film 40 may be thicker than the first covering portion 40a thereof, for example by 1-5 µm. Also, the second covering portion 40b may be thicker than the DAF 30, for example by 1-5 µm.

The protective film 40 may contain a so-called resist material including, for example, a thermosetting resin such as polyimide, a photoresist such as a phenol resin, and a water-soluble resist such as an acrylic resin. The protective film 40 may be formed by, for example, forming a sheet of the resist material and then attaching the sheet to the first surface 10X and the first exposed region 30a, or by applying a material solution of the resist material to the first surface 10X and the first exposed region 30a by means of a spin-coating or spray-coating technique. The thickness of the protective film 40 may be modified locally by adjusting the applied amount of the material solution. The applied amount of the material solution may be adjusted by using both of the spin-coating technique and the spray-coating technique.

Figure 5:
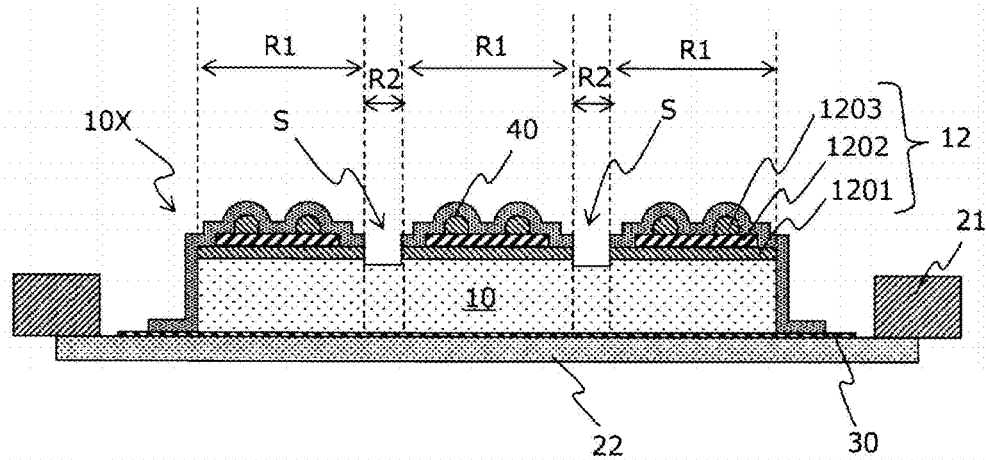
FIG. 5 is a cross-sectional view of the substrate, schematically illustrating the fourth step of the manufacturing process of the element chip according to the embodiment.

(4) Fourth Step: The protective film 40 is scribed or etched to form a plurality of grooves S hereby to expose the substrate 10 in the dicing region R2. FIG. 5 is a cross-sectional view of the substrate 10, schematically illustrating the fourth step of the manufacturing process of the element chip.

The grooves S may be formed by removing portions of the protective film 40 made as a photoresist, which corresponds to the dicing regions R2, by means of a photolithography technique. More particularly, the grooves S may be formed by removing portions of the protective film 40 made of the thermosetting resin or the soluble resist, which corresponds to the dicing regions R2, by means of a laser-scribing technique.

FIGS. 6-9 are schematic top plan views of the conveying carrier configured to hold the substrate 10, of which grooves S in the protective film 40 are formed in the fourth step, illustrating various profiles or patterns of the grooves S. In FIGS. 6-9, the protective film 40 and the frame 21 are conveniently depicted with hatchings.

Figure 6:
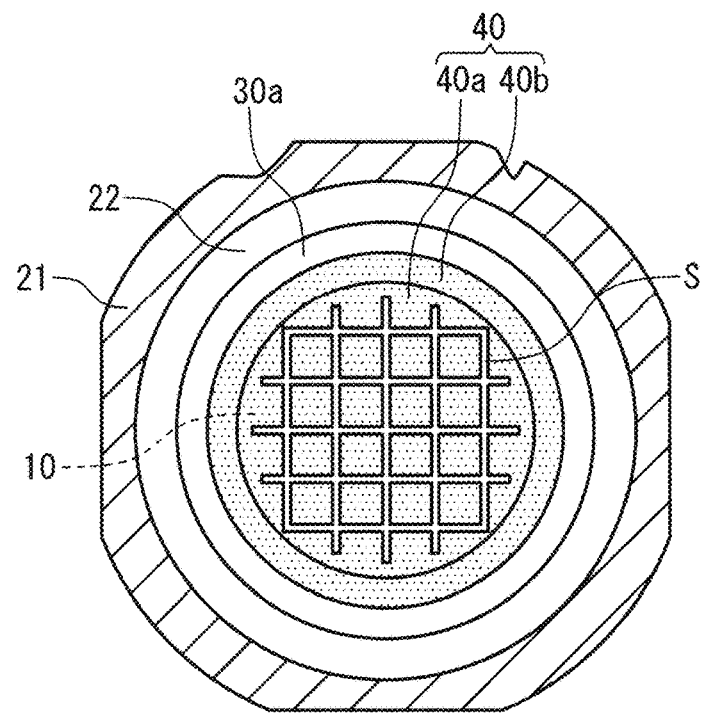
FIG. 6 is a schematic top plan view of a conveying carrier configured to hold the substrate defining grooves in a profile or pattern.
Figure 7:
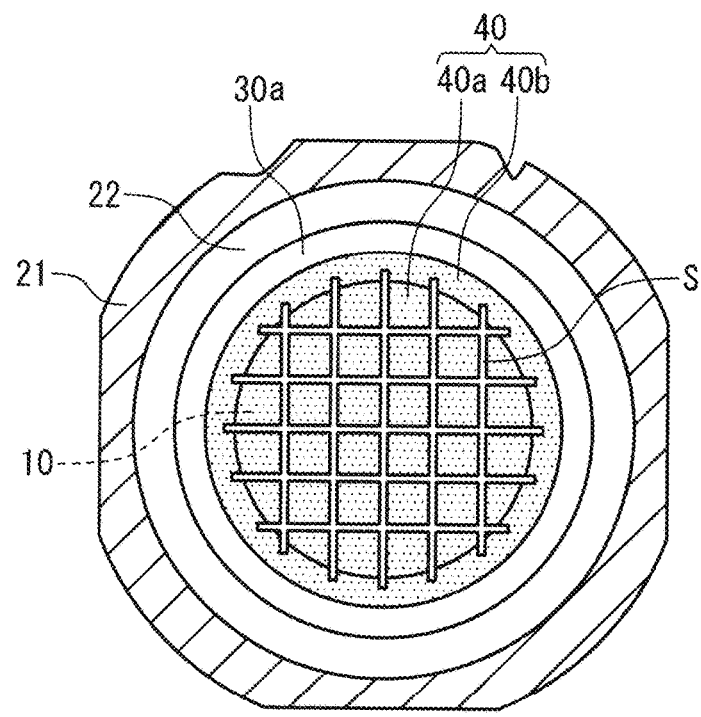
FIG. 7 is a schematic top plan view of the conveying carrier configured to hold the substrate defining grooves in another profile or pattern.
Figure 8:
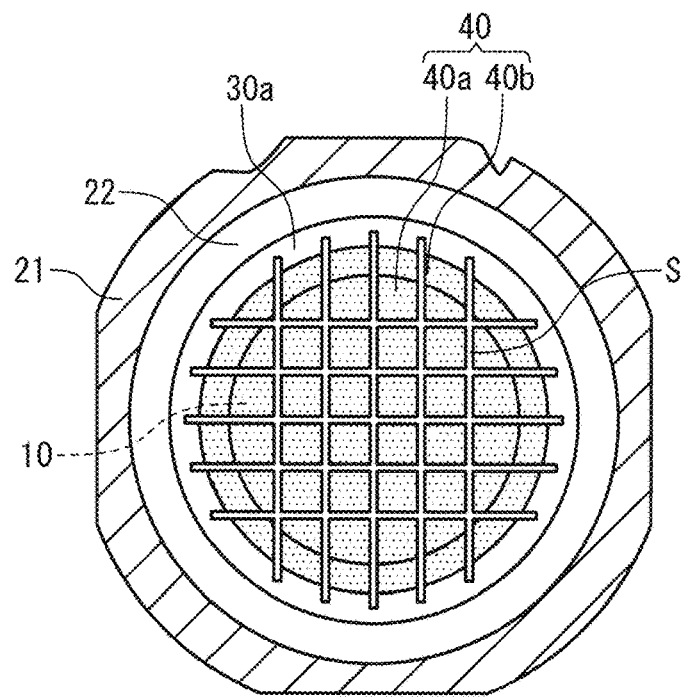
FIG. 8 is a schematic top plan view of the conveying carrier configured to hold the substrate defining grooves in a further profile or pattern.
Figure 9:
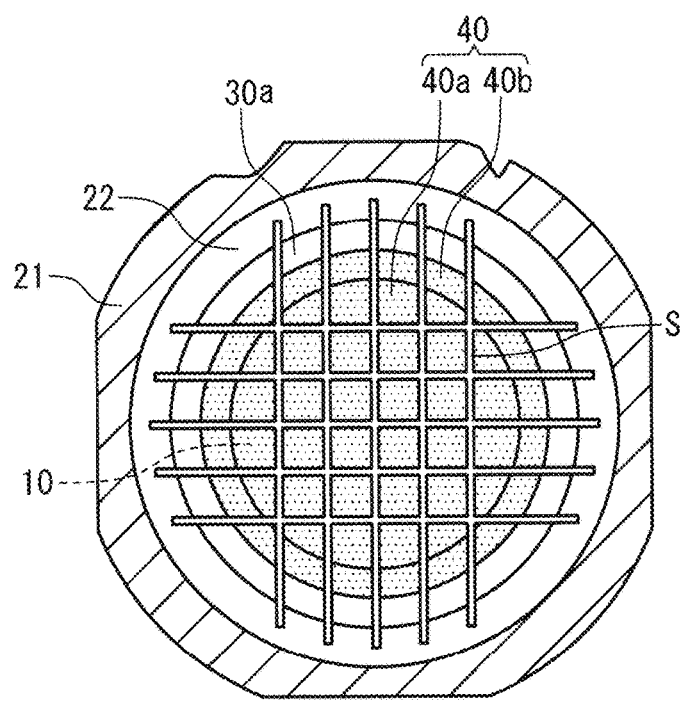
FIG. 9 is a schematic top plan view of the conveying carrier configured to hold the substrate defining grooves in a further profile or pattern.

The grooves S may be formed only within the first covering portion 40a of the protective film 40 (only above the substrate 10) as shown in FIG. 6. The grooves S may be formed within the first covering portion 40a and the protective film 40 in the second covering portion 40b as shown in FIG. 7. The grooves S may be formed within the first covering portion 40a and the protective film 40 in the second covering portion 40b, and on the DAF 30 in the first region 30a as shown in FIG. 8. The grooves S may be formed within the first covering portion 40a and the protective film 40 in the second covering portion 40b, and on the DAF 30 in the first region 30a and the holding sheet 22 exposed between the DAF 30 and the frame 21 as shown in FIG. 9. However, it is preferable to form the grooves S within the first covering portion 40a (above the substrate 10) and the protective film 40 in the second covering portion 40b as shown in FIG. 7, and optionally on the DAF 30 in the first region 30a as shown in FIG. 8. This allows dicing the substrate 10 beyond the outermost edge thereof, thereby to maximize the production yield of the element chips without a waste, and eliminates the damage to the holding sheet 22 due to the laser irradiation thereon.

In the fourth step, the grooves S may be formed by removing portions of the protective film 40 until the semi-conductor layer 11 in the dicing region R2 is exposed as shown in FIG. 5. Thus, the circuit layer 12 may be separated according to a plurality of the element regions R1, by adapting the laser-scribing technique, a mechanical dicing technique, and a plasma-etching technique, for example. Also, the circuit layer 12 may be separated in the first step for preparing the substrate 10, or in the fifth step by plasma-etching the protective film 40 as will be described later. The plasma-etching condition for forming the grooves S in the protective film 40 may be different from one for generating a first plasma atmosphere as will be described hereinafter. For example, the protective film 40 is plasma-etched to form grooves S by the plasma exposure with a material processing gas containing argon gas (Ar), and then change the plasma-etching condition to one for generating a first plasma atmosphere to plasma-etch the semiconductor layer 11 in accordance with the Bosch process.

Figure 10:
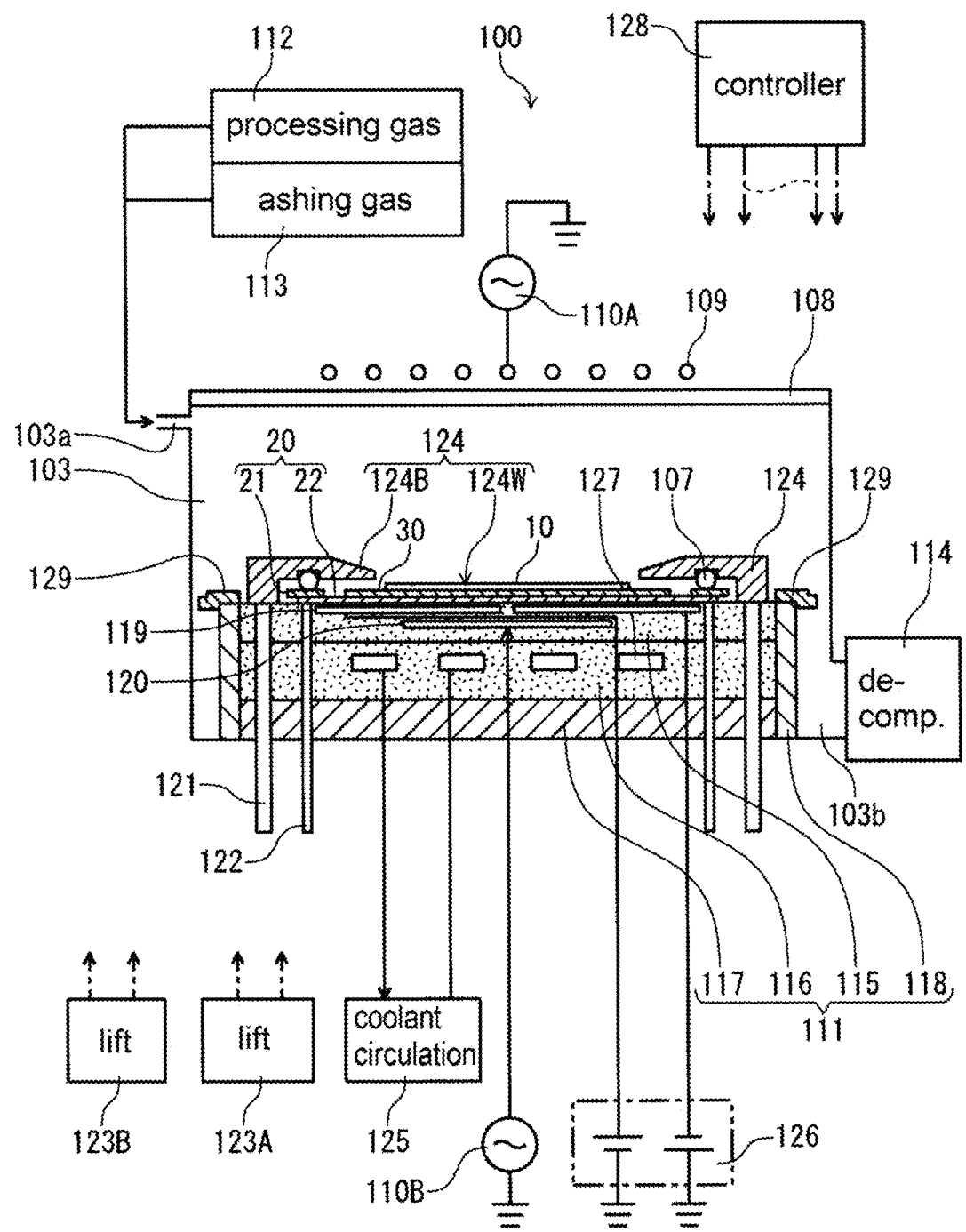
FIG. 10 is a conceptual cross-sectional view of a plasma processing apparatus.

(5) Fifth Step: Referring to FIG. 10, a plasma processing apparatus 100 used for plasma etching in the fifth and sixth steps according to the embodiment will be described in detail hereinafter. Although not limited thereto, FIG. 10 depicts a schematic structure in a cross section of the plasma processing apparatus 100, in which the protective film 40 is conveniently omitted for descriptive purposes.

(Plasma Processing Apparatus) The plasma processing apparatus 100 includes a stage 111, on which the conveying carrier 20 is set so that the adhesive side of the holding sheet 22 adhering the substrate 1 faces upwardly. The stage 111 has a size such that the whole conveying carrier 10 can be seated thereon. Arranged over the stage 111 is a cover 124 including a body 124B covering the frame 21 and a window 124W uncovering at least a portion of the substrate 10. The cover 124 is provided with a biasing member 107 for biasing the frame 21 downward when the frame 21 is set on the stage 111. The biasing member 107 may preferably be a component for achieving a point contact with the frame 21 such as a coil spring and an elastic resin. This restricts a thermal communication between the frame 21 and the cover 124, and allows correcting a distortion of the frame 21.

The stage 111 and the cover 124 are received within a vacuum chamber (reaction chamber) 103. The vacuum chamber 103 is shaped in a substantially cylindrical configuration having an opening at the top thereof, which is closed by a dielectric member 108 formed as a lid of the vacuum chamber 103. The vacuum chamber 103 may be formed of aluminum, stainless steel (SUS), or aluminum with anodic oxide coating, for example. The dielectric member 108 may be formed of, for example, yttrium oxide ($Y_2O_3$), aluminum nitride (AlN), alumina ($Al_2O_3$), or quartz ($SiO_2$). Arranged on or above the dielectric member 108 is a top or first electrode 109. The first electrode 109 is electrically connected to a first high-frequency power source 110A. The stage 111 is positioned at the bottom side in the vacuum chamber 103.

The vacuum chamber 103 is provided with a gas inlet 103a for introducing a gas and a gas outlet 103b for exhausting the gas. The gas inlet 103a is configured to be connected selectively to one of a material gas sources such as a processing gas source 112 and an ashing gas source 113 each through a conduit. The outlet 103b is connected to a decompressing mechanism 114 having a vacuum pump for exhausting the gas within the vacuum chamber 103 and decompressing it. While the vacuum chamber 103 is supplied with the processing gas, the first electrode 109 is applied with a high-frequency power from the first power source 110A so as to generate the plasma atmosphere within the chamber 103.

The stage 111 includes an electrode layer 115, a metal layer 116, and a base member 117 supporting the electrode layer 115 and the metal layer 116, each having a substantially circular shape. The stage 111 also includes a peripheral member 118 surrounding the electrode layer 115, the metal layer 116, and the base member 117. The peripheral member 118 is formed of a metal having a conductivity and an etching resistance for protecting the electrode layer 115, the metal layer 116, and the base member 117 from the plasma exposure. Provided on an upper surface of the peripheral member 118 is an annular circumferential ring 129 for protecting it from the plasma exposure. The electrode layer 115 and the circumferential ring 129 may be formed of the dielectric material as listed above.

Arranged within the electrode layer 115 are a first or electrostatic chuck (ESC) electrode 119 and a second electrode 120 connected to a second high-frequency power source 110B. The ESC electrode 119 is electrically connected to a DC power source 126. The electrostatic chucking mechanism is composed of the ESC electrode 119 and the DC power source 126. The holding sheet 3 is pulled on and secured to the stage 111 by means of the electrostatic chucking mechanism. Although this embodiment describes the electrostatic chucking mechanism as an example of the securing mechanism for securing the holding sheet 3 to the stage 111, the securing mechanism is not limited thereto. Alternatively, the securing mechanism for securing the holding sheet 3 to the stage 111 may be performed by a clamp (not shown).

The metal layer 116 may be formed of aluminum with an anodic oxidation coating, for example. The metal layer 116 contains a coolant channel 127 configured to cool the stage 111. The holding sheet 22 seated on the stage 111 is cooled down by cooling the stage 111. Also, the cover 124 whose portion contacts with the stage 111 is also cooled down. This protects the substrate 10 and the holding sheet 22 from being damaged due to a heat applied during the plasma processing step. A coolant in the coolant channel 127 is circulated by a coolant circulation apparatus 125.

Provided around the peripheral portion of the stage 111 is a plurality of supporting members 122 extending therethrough. Each of the supporting members 122 supports the frame 21 of the conveying carrier 20. The supporting members 122 are driven by a lifting mechanism 123A to move upward and downward. The conveying carrier 20 is delivered into the vacuum chamber 103, and passed on the supporting members 122 which has been raised at a given level. Then the supporting members 122 are lowered with the top surface being flush with or lower than the stage 111, which sets the conveying carrier 20 on the stage 111 at a predetermined position thereof.

Also, a plurality of lifting rods 121 are coupled to the peripheral edge of the cover 124 for moving it upward and downward. The lifting rods 121 are driven by another lifting mechanism 123B. The operation of the lifting mechanisms 123A, 123B can be controlled independently each other.

The controller 128 is configured to control operations of the plasma processing apparatus 100 which includes the first high-frequency power source 110A, the second high-frequency power source 110B, the processing gas source 112, the ashing gas source 113, the decompressing mechanism 114, the coolant circulation apparatus 125, the lifting mechanisms 123A, 123B, and the electrostatic chucking mechanism.

Figure 11:
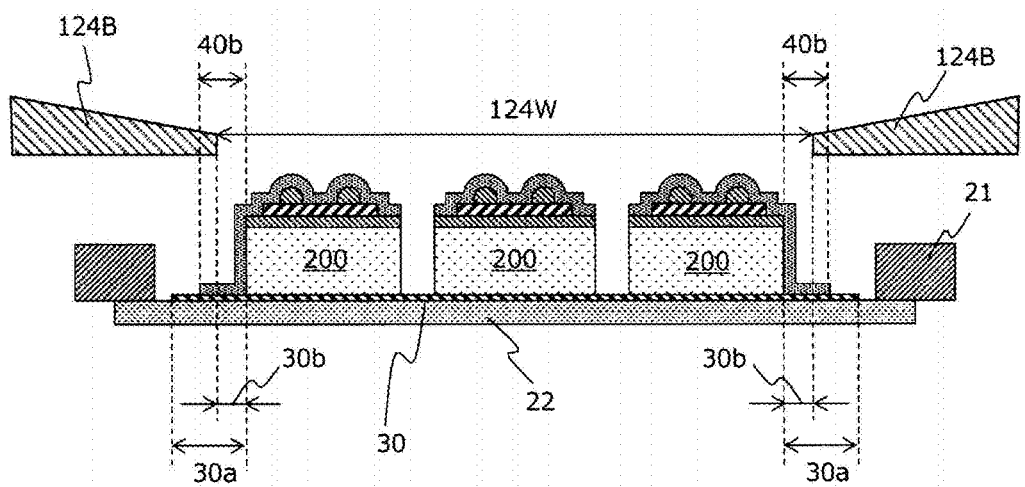
FIG. 11 is a schematic cross-sectional view of the element chips produced in the fifth step of the manufacturing process of the element chip according to the embodiment.

In the fifth step, the substrate 10 is subjected to the first plasma exposure to plasma-etch the substrate 10 exposed in the dicing regions R2, thereby to expose the DAF 30. Those steps produce a plurality of the element chips 200 from the substrate 10. FIG. 11 is a schematic cross-sectional view of the element chips produced in the fifth step of the manufacturing process according to the embodiment.

After the conveying carrier 20 holding the substrate 10 is delivered into the vacuum chamber 103, the substrate 10 is plasma-etched while being seated on the stage 111. When delivering the conveying carrier 20, the cover 124 is raised at a given level by means of the lifting rods 121 in the vacuum chamber 103. The conveying carrier 20 is delivered or loaded within the vacuum chamber 103 while a gate valve (not shown) is open to receive it. A plurality of the supporting rods 122 are kept at the raised position. When the conveying carrier 20 is delivered to a given position above the stage 111, it is passed onto the supporting rods 122. The conveying carrier 20 is seated on the top end of the supporting rods 122, so that the adhesive side 22a of the supporting member 22 faces upward.

After the conveying carrier 20 is passed onto the supporting rods 122, the vacuum chamber 103 is closed in a hermetically sealed condition, and the supporting rods 122 are lowered. When the top ends of the supporting rods 122 are lowered to the level same as or lower than the level of the stage 111, the conveying carrier 20 is set on the stage 111. Then the lifting rods 121 are driven to lower the cover 124 to a predetermined level. The distance or gap between the cover 124 and the stage 111 is adjusted so that the each of the biasing members 107 provided on the cover 124 achieves a point contact with the frame 21. Thus, the frame 21 is pushed down by the biasing members 107, and the body 124B of the cover 124 overlaps the frame 21 so that the substrate 10 is uncovered through the window 124W of the cover 124.

The body 124B of the cover 124 is, for example, doughnut-shaped having a substantially circular outline, and a having a constant width and thickness. The inner diameter of the cover body 124B (i.e., a diameter of the window 124W) is smaller than the inner diameter of the frame 21, and the outer diameter of the cover body 124B is greater than the outer diameter of the frame 21. Therefore, when the conveying carrier 20 is set on the stage at a predetermined position and the cover 124 is lowered, the cover body 124B overlaps the frame 21. Also, at least a portion of the substrate 10 and a portion of the DAF 30 are uncovered through the window 124W.

When the plasma processing apparatus 100 includes the cover 124, the protective film 40 may preferably overlap the uncovered DAF 30 through the window 124W. Thus, when viewed from the top side 10X of the substrate 10, the second covering portion 40b of the protective film 40 may preferably cover the DAF 30 in a second exposed region 30b among the first exposed region 30a where the DAF 30 is uncovered through the window 124W. This prevents the DAF 30 from being plasma-etched, thereby to further suppress scattering the non-volatile material.

The body 124B of the cover 124 may be made of material, including for example, a ceramic such as alumina and aluminum nitride (AlN), a dielectric such as quarts, and a metal such as aluminum with/without an anodic oxidation coating. The biasing members 107 may be made of resin material, besides the aforementioned dielectric and metal.

After the conveying carrier 10 is passed onto the supporting members 122, the ESC electrode 119 is applied with the voltage from the DC power 126. This allows the supporting member 22 to be secured on the stage 111 immediately after the supporting member 22 contacts the stage 111. Alternatively, the voltage application to the ESC electrode 119 may be initiated after the supporting member 22 is set on (or contact) the stage 111.

In this step, the substrate 10 is subjected to the first plasma exposure for plasma-etching the substrate exposed along the grooves S in the dicing regions R1, thereby to form a plurality of the element chips and expose the DAF 30 along the grooves S. The condition for generating the plasma atmosphere may be selected in accordance with the material of the semiconductor layer 11 to be etched.

The semiconductor layer 11 may be plasma-etched in the Bosch process, in which the semiconductor layer 11 is etched in a depth direction. When the semiconductor layer 11 contains silicon, the Bosch process is carried out by repeatedly depositing a protective layer, etching the deposited or protective layer, and etching the silicon layer to dig each of the grooves S in a depth direction. During those steps, each of the etched grooves S of the semiconductor layer 11 has a plurality of asperity or irregularity on a side wall of the grooves S, which are called as a scallop.

In the step for depositing the protective layer, for example, while the vacuum chamber 103 may be supplied with the source gas of $C_4H_8$ at a flow rate of 150-250 sccm to have the pressure controlled between 15-25 Pa, the first electrode 109 may be applied with power of 1500-2500 W from the first high-frequency source 110A, and the second electrode 120 may be applied with power of 0-50 W from the second high-frequency source 110B, for the processing time of 2-15 seconds.

In the step for etching the deposited or protective layer, for example, while the vacuum chamber 103 may be supplied with the source gas of $SF_6$ at a flow rate of 200-400 sccm to have the pressure controlled between 5-15 Pa, the first electrode 109 may be applied with power of 1500-2500 W from the first high-frequency source 110A, and the second electrode 120 may be applied with power of 300-1000 W from the second high-frequency source 110B, for the processing time of 2-10 seconds.

In the step for etching the semiconductor layer 11 of silicon, for example, while the vacuum chamber 103 may be supplied with the source gas of $SF_6$ at a flow rate of 200-400 sccm to have the pressure controlled between 5-15 Pa, the first electrode 109 may be applied with power of 1500-2500 W from the first high-frequency source 110A, and the second electrode 120 may be applied with power of 50-200 W from the second high-frequency source 110B, for the processing time of 10-20 seconds.

Under those aforementioned conditions, the step for depositing the protective layer, the step for etching the deposited or protective layer, and the step for etching the semiconductor layer 11 of silicon may be repeatedly performed so as to deeply dig the semiconductor layer 11 of the substrate 10 along each of the dicing regions Ry in a thickness direction at a rate between 10-20 μm per minute.

Furthermore, the circuit layer 12 containing a metal may be etched, for example, in a following condition. While the vacuum chamber 103 may be supplied with the mixed processing gas of $CF_4$ and Ar ($CF_4$:Ar=1:4) at a flow rate of 150-250 sccm to have the pressure controlled between 0.2-1.5 Pa, the first electrode 109 may be applied with power of 1500-2500 W at the high frequency of 13.56 MH from the first high-frequency source 110A, and the second electrode 120 may be applied with power of 500-1800 W from the second high-frequency source 110B at the high frequency of 100 kH or more (for example, in a range between 400-500 kHz or 13.56 MHz).

Figure 12:
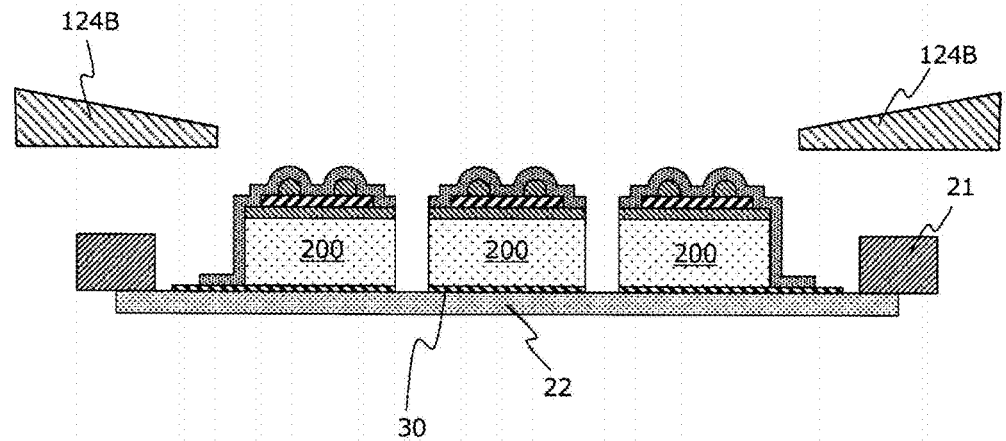
FIG. 12 is a schematic cross-sectional view of the element chips produced in the sixth step of the manufacturing process of the element chip according to the embodiment.

(6) Sixth Step: The substrate 10 is subjected to the second plasma exposure for plasma-etching the exposed DAF 30 through the grooves to separate or cut off the DAF 30, corresponding to the element chips 200. Thus, a plurality of the element chips 200 are produced in the sixth step, each of which is held by the holding sheet 22 with the separated DAF 30 in between. FIG. 12 is a schematic cross-sectional view of the element chips 200 produced in the sixth step of the manufacturing process according to the embodiment.

The condition for generating the second plasma atmosphere is selected in accordance with the material of the DAF 30 to be etched. In case that the DAF 30 is made of the resin composition containing the resin and the inorganic filler, the second plasma atmosphere may preferably be generated with the processing gas containing oxygen and fluorine. Oxygen free radials originated from the gas containing the oxygen are highly reactive with an organic material such as the resin. Fluorine free radials originated from the gas containing the fluorine are highly reactive with the inorganic filler. Thus, the processing gas containing oxygen and fluorine may be used to plasma-etch the DAF 30 including the inorganic filler in an efficient manner, and also to facilitate to prevent the inorganic filler from scattering in the vacuum chamber. The processing gas containing oxygen and fluorine may include a mixed gas including the oxygen ($O_2$) gas and a fluorine-containing gas ($SF_6$, $CF_4$). The rate of flow amounts of the fluorine-containing gas over the total mixed gas may be, for example, 5% or more.

Besides, in generating the second plasma atmosphere, the vacuum chamber 103 preferably has an inside pressure controlled in a range between 5-10 Pa. Also, the second electrode 120 is applied with a high-frequency power of 500-1000 W to apply a high biasing voltage on the stage 111. This causes the etched material more ionic and facilitate to prevent the inorganic filler from scattering in a more efficient manner. However, the higher biasing voltage likely causes the higher temperature of the DAF 30 on the stage 111. It is preferable to cool down the stage 111 at 15 degrees C. or less so that the temperature of the DAF 30 during the sixth step is kept at 50 degrees C. or less.

In particular, the sixth step is carried out under the following conditions. The vacuum chamber 103 may be supplied with the mixed processing gas of an oxygen gas at the flow rate of 350 sccm and a sulfur hexafluoride ($SF_6$) at the flow rate of 50 sccm, to have the pressure controlled between 5-10 Pa. The first electrode 109 may be applied with high-frequency power of 3000-5000 W, and the second electrode 120 in the stage 111 may be applied with high-frequency power of 500-1000 W. This allows he DAF 30 to be plasma-etched at the etching rate in a range about between 1.5-4.0 μm per minute.

After the plasma-etching of the DAF 30 is completed, the gas in the vacuum chamber 103 is evacuated, and the gate valve (not shown) is opened. The conveying carrier 20 holding a plurality of the element chips 200 is unloaded from the plasma processing apparatus 100 by means of a loading/unloading mechanism (not shown) entering from the gate valve. After the conveying carrier 20 is unloaded, the gate valve is immediately closed. The unloading step of the conveying carrier 20 may be carried out by a procedure opposite to the above-described loading or delivery step. Thus, the cover 124 is lifted to the given position, the power supply to the ESC electrode 119 is cut off to release the conveying carrier 20 from the stage 111, and then the supporting members 122 are moved upward. After the supporting members 122 are moved up to the given level, the conveying carrier 20 is unloaded from the vacuum chamber 103.

Figure 13:
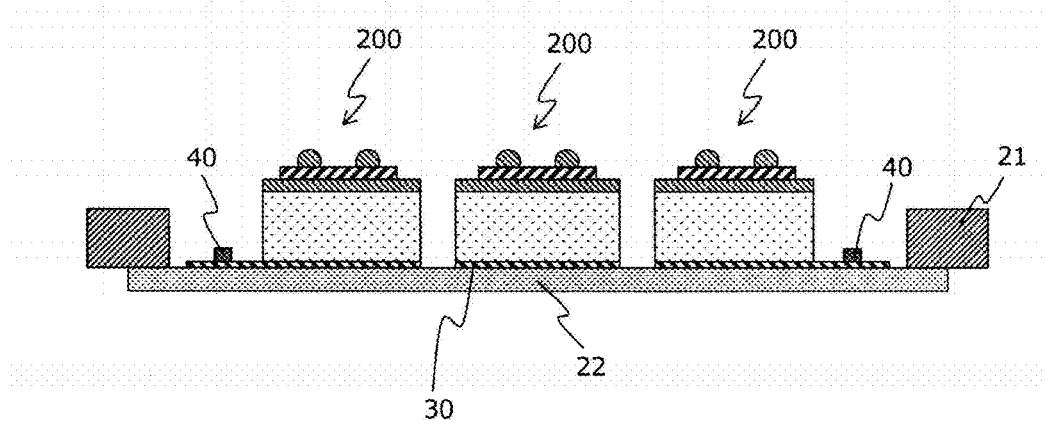
FIG. 13 is a schematic cross-sectional view of the element chips with a protective film removed.

After completing the plasma-etching of the DAF 30 and before unloading the conveying carrier 20 from the vacuum chamber 103, an ashing step may be carried out for the conveying carrier 20, which removes the protective layer 40 uncovered through the window 124W of the cover 124. FIG. 13 is a schematic cross-sectional view of the element chips 200 with the protective film 40 removed.

In the ashing step, while the vacuum chamber 103 may be supplied with the mixed ashing gas of $CF_4$ and $O_2$ ($CF_4$:$O_2$=1:10) at a flow rate of 150-300 sccm to have the pressure controlled between 5-15 Pa, the first electrode 109 may be applied with power of 1500-5000 W from the first high-frequency source 110A, and the second electrode 120 may be applied with power of 0-300 W from the second high-frequency source 110B. It is preferable that the power applied to the second electrode 120 in the ashing step is set to be less than that in the fifth step.

If the protective layer 40 is water soluble, the protective layer 40 may be removed by flushing a water rather than the ashing step.

(7) Seventh Step: Each of the element chips 200 are picked up together with the DAF 30 from the holding sheet 22. Each of the element chips 200 may be pushed up on the non-adhesive side 22b of the holding sheet 20 by a prodding pin. This causes the element chip 200 at least partially raised up from the holding sheet 22. Then, a pick-up device is used to pick the element chip 200 away from the holding sheet 22.

Figure 14:
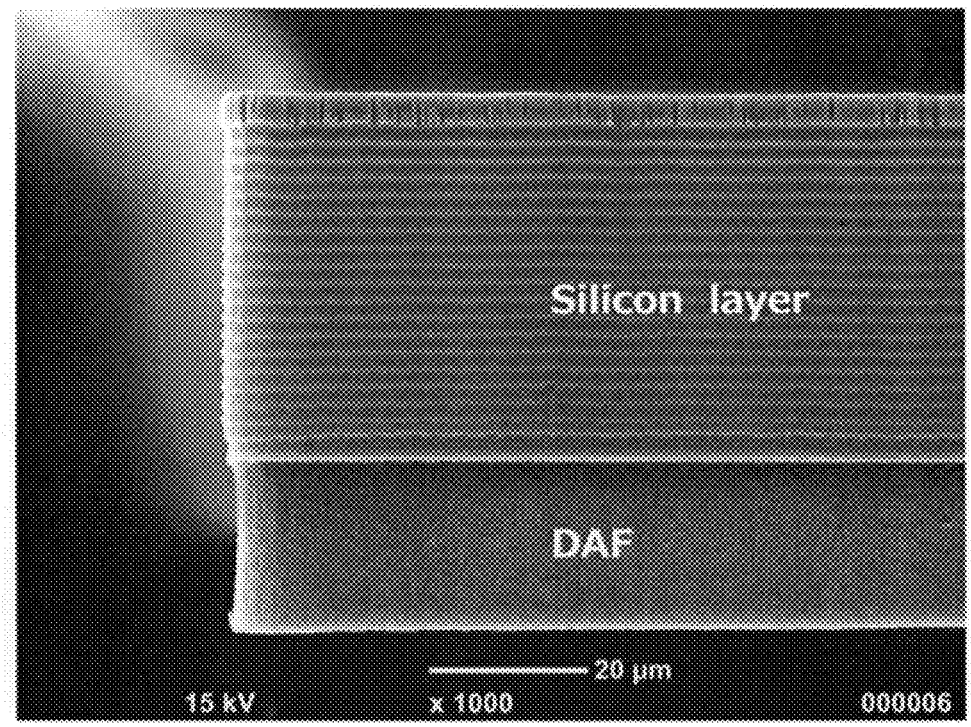
FIG. 14 is an image obtained by a scanning electron microscope (SEM) showing a side surface of the element chip.

FIG. 14 is an image obtained by a scanning electron microscope (SEM: 1000-fold magnification) showing a side surface of the element chip 200 produced according to the manufacturing process thereof. It should be noted that FIG. 14 shows a region where no circuit layer is formed. There are the scallops on the side surface of the silicon layer (semiconductor layer 11) formed by the Bosch process in the fifth step. The DAF 30 is arranged beneath the semiconductor layer 11, which is separated in the sixth step. As shown, the DAF 30 and the semiconductor layer 11 have the side surfaces flush with each other.

[Reference Numerals] 10: substrate, 10X: first side (top side), 10Y: second side (bottom side), 11: semiconductor layer, 12: circuit layer, 1201: multi-stacked wiring layer, 1202: re-wiring layer, 1203: bump, 20: conveying carrier, 21: frame, 21a: notch, 21b: corner cut, 22: holding sheet, 22a: adhesive side, 22b: non-adhesive side, 30: die attach film (DAF), 30a: first exposed region, 30b: second exposed region, 40: protective film, 40a: first coated region, 40b: second coated region, 100: plasma processing apparatus, 103: vacuum chamber, 103a: gas inlet, 103b: gas outlet, 108: dielectric member, 109: first electrode, 110A: first high-frequency power source, 110B: second high-frequency power source, 111: stage, 112: processing gas source, 113: ashing gas source, 114: decompressing mechanism, 115: electrode layer, 116: metal layer, 117: base member, 118: peripheral member, 119: ESC electrode, 120: second electrode, 121: lifting rod, 122: supporting member, 123A, 123B: lifting mechanism, 124: cover, 124B: cover body, 124W: window, 125: coolant circulation device, 126: DC power, 127: coolant channel, 128: controller, 129: circumferential ring, 200: element chip

What is claimed is:

1. A manufacturing process of an element chip, comprising:
    a first step for preparing a substrate having first and second sides opposed to each other, and including a plurality of dicing regions and element regions defined by the dicing regions;
    a second step for attaching a holding sheet held on a frame to the second side of the substrate with a die attach film in between;
    a third step for forming a protective film covering the substrate;
    a fourth step for forming a plurality of grooves in the protective film to expose the substrate along the dicing regions;
    a fifth step for plasma-etching the substrate exposed along the dicing regions within a first plasma atmosphere to form a plurality of element chips from the substrate, and to expose the die attach film;
    a sixth step for plasma-etching the die attach film exposed along the dicing regions within a second plasma atmosphere, to separate the die attach film into pieces corresponding to the element chips; and
    a seventh step for picking up each of the element chips along with the separated die attach film away from the holding sheet,
    wherein the die attach film in the second step has an area greater than that of the substrate,
    wherein the protective film formed in the third step includes a first covering portion covering the first side of the substrate and a second covering portion covering at least a portion of the die attach film that extends beyond an outer edge of the substrate, and
    wherein in the fifth step, the substrate is plasma-etched, with the at least the portion of the die attach film covered with the protective film.

2. The manufacturing process of the element chip according to claim 1, wherein in the fifth step and the sixth step, the substrate is plasma-etched with a cover arranged above the first side of the substrate and below an electrode electrically connected to a high-frequency power source for generating plasma, and wherein
    the cover includes a body covering the frame and includes a window uncovering at least a portion of the substrate and part of the at least the portion of the die attach film.

3. The manufacturing process of the element chip according to claim 1, wherein the first covering portion of the protective film has a thickness greater than that of the second covering portion.

4. The manufacturing process of the element chip according to claim 1, wherein the second covering portion of the protective film has a thickness greater than that of the die attach film.

5. The manufacturing process of the element chip according to claim 1, wherein the die attach film is plasma-etched within the second plasma atmosphere generated by a processing gas containing oxygen and fluorine.

6. The manufacturing process of the element chip according to claim 1,
    wherein in the sixth step, the die attach film is plasma-etched while the at least the portion of the die attach film is covered with the second covering portion of the protective film.

7. The manufacturing process of the element chip according to claim 1, wherein the fifth step and the sixth step are performed in a same plasma processing apparatus.

8. A manufacturing process of an element chip, comprising steps of:
preparing a substrate having first and second sides opposed to each other, and including a plurality of dicing regions and element regions defined by the dicing regions;
attaching the second side of the substrate to a die attach film, the die attach film being detachably adhered to a holding sheet that is held on a frame;
forming a protective film covering the first surface of the substrate, and at least a portion of the die attach film that extends beyond an outer edge of the substrate;
forming a plurality of grooves in the protective film along the dicing regions; and
etching the substrate along the grooves under a first plasma etching condition, and then etching the die attach film along the grooves under a second plasma etching condition to separate the die attach film into pieces corresponding to a plurality of element chips,
wherein the etching of the substrate along the grooves under the first plasma etching condition is performed while the at least the portion of the die attach film is covered with the protective film.

9. The manufacturing process of the element chip according to claim 8, further comprising a step for picking up each of the element chips together with the separated die attach film away from the holding sheet.

10. The manufacturing process of the element chip according to claim 8, wherein the substrate is etched with a cover arranged above the first side of the substrate and below an electrode electrically connected to a high-frequency power source for generating plasma,
wherein the cover includes a body covering the frame and includes a window uncovering at least a portion of the substrate and the at least the portion of the die attach film, and wherein the protective film covers the die attach film uncovered through the window.

11. The manufacturing process of the element chip according to claim 8, wherein the protective film includes a first covering portion covering the first side of the substrate and a second covering portion covering the at least the portion of the die attach film that extends beyond the outer edge of the substrate.

12. The manufacturing process of the element chip according to claim 11, wherein the second covering portion of the protective film has a thickness greater than that of the die attach film.

13. The manufacturing process of the element chip according to claim 8, wherein the die attach film is etched under the second plasma etching condition with a processing gas containing oxygen and fluorine.

14. The manufacturing process of the element chip according to claim 8,
wherein the etching of the die attach film along the grooves under the second plasma etching condition is performed while the at least the portion of the die attach film is covered with the protective film.

15. The manufacturing process of the element chip according to claim 8, wherein the etching of the substrate and the etching of the die attach film are performed in a same plasma processing apparatus.

* * * * *